US006505914B2

(12) United States Patent
Hofer et al.

(10) Patent No.: US 6,505,914 B2
(45) Date of Patent: Jan. 14, 2003

(54) MICROACTUATOR BASED ON DIAMOND

(75) Inventors: Eberhard P. Hofer, Lonsee (DE); Erhard Kohn, Ulm (DE); Christian Rembe, Ulm (DE); Stefan Aus Der Wiesche, Ulm (DE); Peter Gluche, Neu-Ulm (DE); Rudiger Leuner, Neu-Ulm (DE)

(73) Assignee: Merckle GmbH, Blaubeuren (DE)

( * ) Notice: Subject to any disclaimer, the term of this patent is extended or adjusted under 35 U.S.C. 154(b) by 0 days.

(21) Appl. No.: 10/011,623

(22) Filed: Dec. 4, 2001

(65) Prior Publication Data

US 2002/0044174 A1 Apr. 18, 2002

Related U.S. Application Data

(63) Continuation of application No. 09/509,708, filed as application No. PCT/DE98/02956 on Oct. 1, 1998.

(30) Foreign Application Priority Data

Oct. 2, 1997 (DE) .......................................... 197 43 798
Feb. 27, 1998 (DE) .......................................... 198 08 326

(51) Int. Cl.[7] ................................ B41J 2/05; H05B 3/26
(52) U.S. Cl. .......................... 347/63; 338/314; 219/543
(58) Field of Search .............................. 347/56, 61, 62, 347/63, 64, 17, 18; 338/314; 219/541, 543, 553

(56) References Cited

U.S. PATENT DOCUMENTS

| 3,999,525 A | | 12/1976 | Stumpp | 123/557 |
| 4,663,640 A | * | 5/1987 | Ikeda | 347/63 |
| 4,797,108 A | * | 1/1989 | Crowther | 437/41 |
| 4,990,939 A | | 2/1991 | Sekiya | 347/62 |
| 5,027,499 A | * | 7/1991 | Prohaska | 29/595 |
| 5,075,690 A | * | 12/1991 | Kneezel | 347/17 |
| 5,170,242 A | * | 12/1992 | Stevens et al. | 257/751 |
| 5,348,909 A | * | 9/1994 | Stasiak | 347/64 |
| 5,407,276 A | * | 4/1995 | Jones | 374/184 |
| 5,488,350 A | * | 1/1996 | Aslam et al. | 338/225 |
| 5,629,482 A | * | 5/1997 | Vaitkus et al. | 73/204.24 |
| 5,661,503 A | * | 8/1997 | Terai | 347/63 |
| 5,695,670 A | * | 12/1997 | Fujii et al. | 219/543 |
| 6,086,187 A | * | 7/2000 | Hattori et al. | 347/63 |
| 6,132,030 A | * | 10/2000 | Cornell | 347/57 |

FOREIGN PATENT DOCUMENTS

| DE | 4016935 | 11/1991 |
| GB | 2296371 | 6/1996 |
| JP | 61031263 | 2/1986 |
| JP | 08261853 | 10/1996 |

OTHER PUBLICATIONS

"CVD Diamond Resistor as Heater and Temperature Sensor", G.S. Yang and M. Aslam, Applications of Diamond Films and Related Materials:Third International Conference, 1995, pp. 125–128.

* cited by examiner

Primary Examiner—John Barlow
Assistant Examiner—Blaise Mouttet
(74) Attorney, Agent, or Firm—Barnes & Thornburg

(57) ABSTRACT

The invention relates to a microactuator arranged on a thermally insulating layer (2) and having a resistance layer (4) made from doped diamond, which is provided with an electrical supply and an electrical leakage (9).

19 Claims, 3 Drawing Sheets

MICROACTUATOR BASED ON DIAMOND

Cross Reference to Related Applications

Figure 1A:
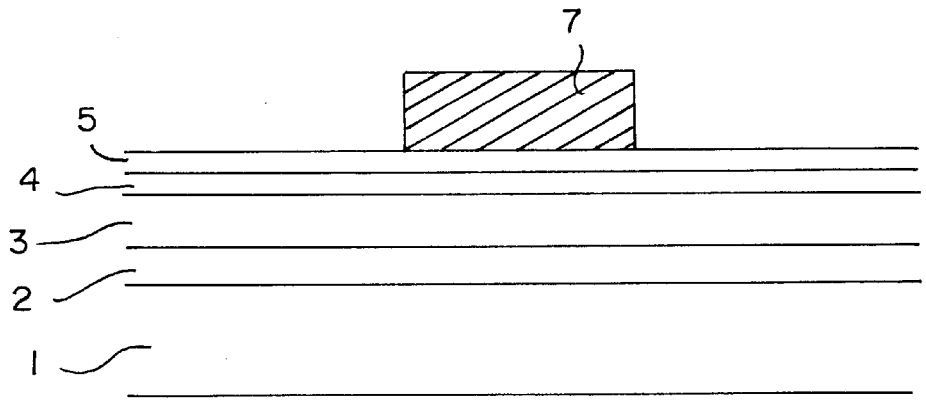

This application is a continuation of U.S. patent application Ser. No. 09/509,708, filed on Jul. 6, 2000, which is a U.S. national phase application of international application Ser. No. PCT/DE98/02956, filed Oct. 1, 1998, which claims priority to German patent application serial no. 198 08 326.2, filed on Feb. 27, 1998, and to German patent application serial no. 197 43 798.2, filed on Oct. 2, 1997.

The invention relates to a microactuator having a resistance layer made from doped diamond, which is provided with an electrical supply and an electrical leakage.

Microactuators based on silicon have already been used for a long time even in commercial form. The thermopneumatic actuators integrated in ink-jet printing heads may be mentioned by way of example. In actuators of this type a liquid layer adjoining the microactuator is heated in the course of a few microseconds to over 300° C. with the aid of a metallic resistance layer which can be heated by electric current and evaporated explosively. The pressure produced during bubble expansion is used to accelerate an ink droplet onto the medium to be printed. The thermal actuator, and in particular the resistance layer, is exposed to severe loads due to the high temperatures thus occurring and high pressures (cavitation effects). In order to increase the service life of actuators of this type, the resistance layers are therefore often provided with several stabilising layers.

A microactuator on a diamond film having a resistance layer of boron-doped diamond is known from "Fabrication of micron scaled resistor's using a diamond-on-silicon heteroepitaxial structure", R. Leuner et al., 6$^{th}$ European Heterostructure Technology Workshop, Lille, France, 15$^{th}$–19$^{th}$ September 1996. The mechanical stabilising layers required in traditional actuators may be omitted without replacement in resistance layers made from diamond due to the high mechanical stability as well as the thermal and chemical resistance of diamond. However, it has been shown that in microactuators based on diamond a large part of the heat generated in the resistance layer diffuses into the diamond film arranged below the resistance layer due to the high thermal conductivity of diamond. This diffusion considerably impairs the efficiency of a diamond heating element.

To solve this problem it is proposed to thin the diamond substrate on the rear side in the region of the microactuator by reactive ion etching. However, such thinned substrates have extremely low mechanical stability, so that for example the explosive evaporation of a liquid would effect destruction of the microactuator. In addition, lateral heat diffusion still occurs even for a thinned diamond substrate.

Starting from this and further disadvantages of the state of the art, the object of the invention is to provide a microactuator based on diamond which has both high mechanical stability and high efficiency. In addition, the microactuator should be simple to manufacture as well as having many uses and in particular for overheating or evaporating fluid media, such as gases or liquids.

This object is achieved by a microactuator according to claim 1. The sub-claims relate to advantageous embodiments and further developments of the invention.

In a microactuator containing at least one resistance layer made from doped diamond or graphitic diamond (diamond-like carbon), which is arranged on a thermally insulating layer, diffusion of the heat generated in the resistance layer is clearly reduced and the efficiency of the microactuator thus considerably improved. In contrast to microactuators of the state of the art, the microactuator of the invention is neither in thermal contact with a large surface area diamond film nor with further heat sinks due to appropriate structuring. Lateral diffusion of the heat can be prevented by measures, such as mesa etching or selective growth. Thermal diffusion into the substrate is also excluded due to the vertical layer structure having a thermal insulation layer. The use of the insulation layer renders superfluous thinning of the substrate known from the state of the art, so that the microactuators of the invention may be arranged on mechanically stable, commercial substrates.

The insulating layer preferably has a thermal conductivity of below 1 W cm$^{-1}$ K$^{-1}$ at 300 K and may consist of materials, such as for example silicon oxides, silicon nitrides, silicon oxinitrides, and aluminum oxides. In order to guarantee adequate thermal insulation of the microactuator, the thickness of the insulating layer should be at least 0.25 $\mu$m and preferably lie in a range between 1 $\mu$m and 10 $\mu$m. The insulation layer particularly preferably consists of amorphous materials which have low thermal conductivities. The insulation layer preferably has none or only low electrical conductivity.

The doped resistance layer may be grown directly on the insulating layer. Alternatively, it is also conceivable to provide one or more intermediate layers between resistance layer and insulating layer. In order to avoid lateral heat diffusion, the at least one intermediate layer should either itself be a thermal insulator or be laterally structured.

The resistance layer of the microactuator preferably has a surface area of less than 1 mm$^2$ and particularly preferably of less than 100×100 $\mu$m$^2$. Surprisingly, it has been shown that the combination of microactuator-inherent low surface area and insulation layer which is essential to the invention, permits surface area heating densities in the range of megawatts per cm$^2$. Such high surface area heating densities are a precondition for a number of preferred applications of the microactuator of the invention. Hence, for example liquid layers adjoining the microactuator could be overheated to over 300° C. in the course of a few microseconds during dynamic operation. It could thus be proved that even microactuators based on diamond are suitable as thermopneumatic microactuators for ejecting fluid media.

The use of the thermopneumatic microactuator for emission of fluids by local overheating and explosive evaporation requires the presence of an emission structure arranged in the region of the resistance layer, and which advantageously has in each case at least one chamber and one nozzle as well as a channel for supplying the fluid medium.

A preferred embodiment of the invention envisages recording heat release from the microactuator of the invention by means of temperature sensors integrated monolithically with the microactuator in order to guarantee exact control of the microactuator. However, whereas a strong dependence of layer resistance on the temperature is desirable for a temperature sensor, when using the microactuator as a thermal microactuator the resistance layer should have a virtually temperature-independent resistance. The doping material concentration in the resistance layer should therefore be at least 10$^{19}$ cm$^{-3}$. At lower doping material concentration and if a certain temperature dependence of heating behaviour is accepted, the microactuator itself may also act as a temperature sensor.

The invention is described in more detail below using figures and preferred exemplary embodiments.

Figure 2:
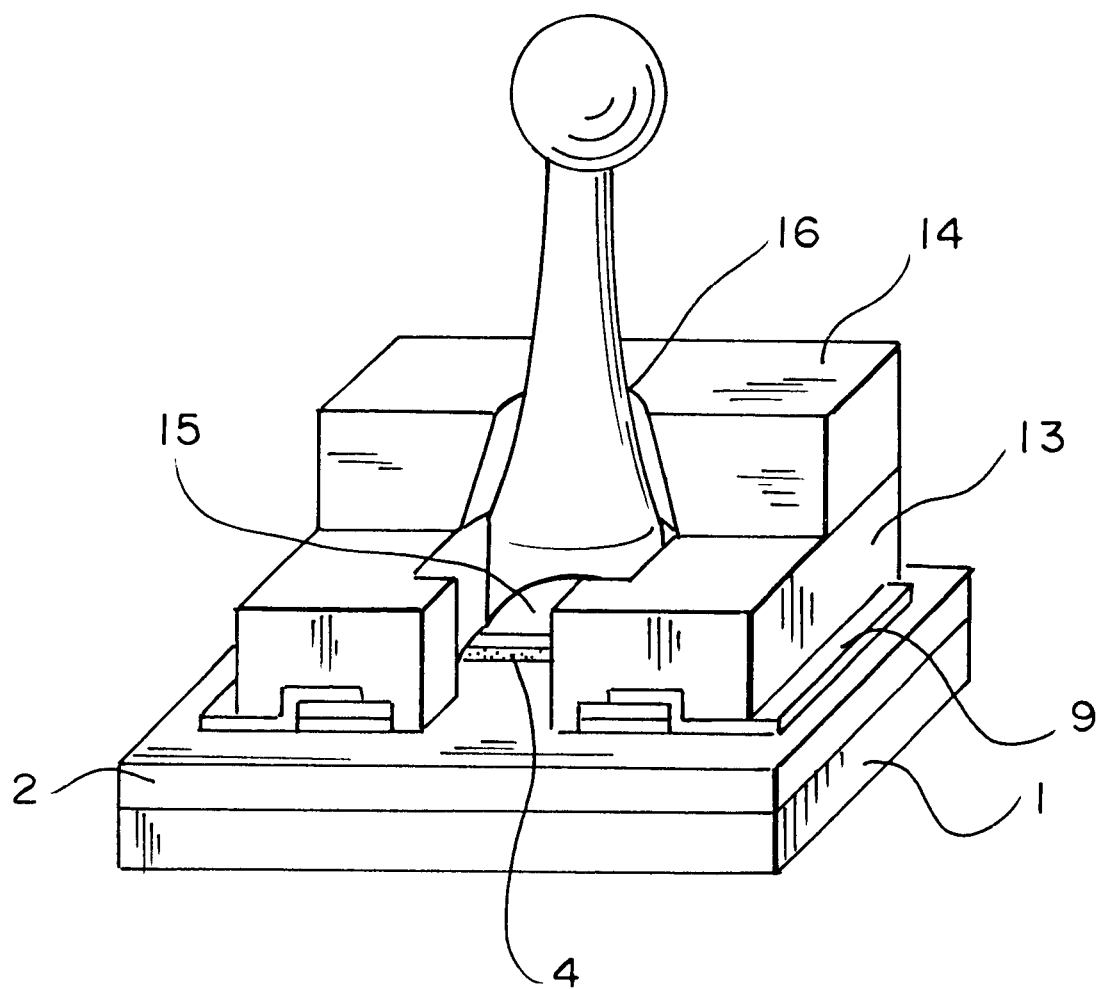

FIGS. 1a)–1c): show the structuring of a microactuator of the invention;

FIG. 2: shows a microactuator of the invention with emission structures; and

Figure 3:
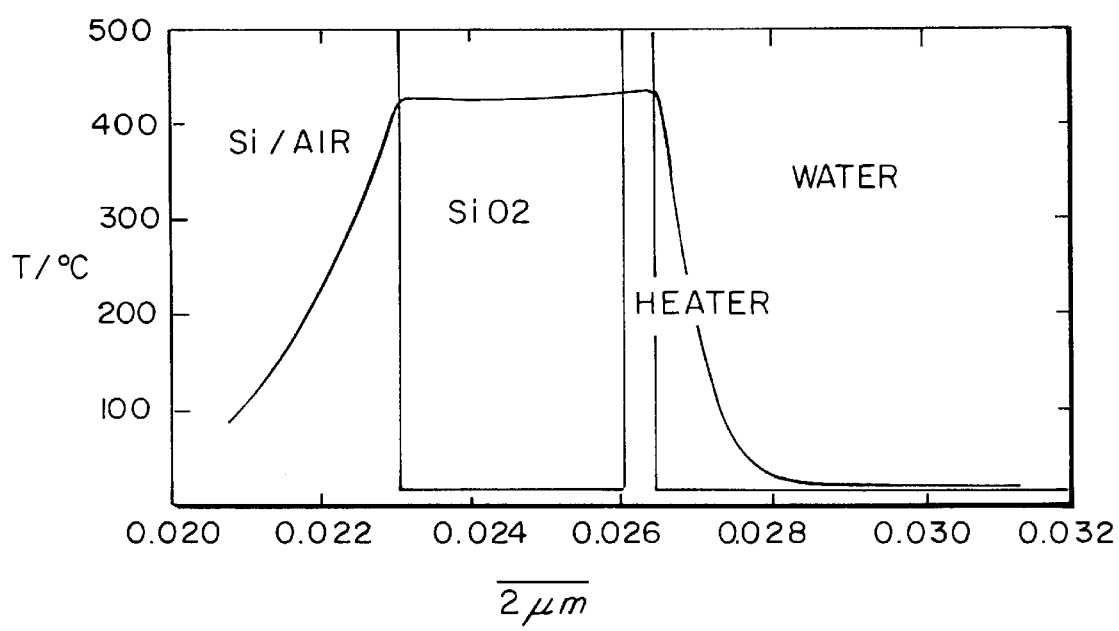

FIG. 3: shows the simulation of the vertical temperature path for a microactuator of the invention.

The structuring of a microactuator is sketched in FIGS. 1a) to 1c). A 3 µm thick $SiO_2$ layer 2 is deposited initially on a silicon carbide or silicon substrate 1 with the aid of CVD technology to produce the layer structure shown in FIG. 1 a). Polycrystalline intrinsic diamond is applied to the $SiO_2$ layer 2 likewise by means of a CVD process. For a layer thickness of the intrinsic diamond film 3 of approximately 1µm, a solid boron source is introduced into the deposition apparatus and $p^+$-doped diamond is grown farther up to a thickness of 400 nm using a doping material concentration of $10^{20}-10^{21}$ cm$^{-3}$. The $p^+$-doped diamond film acts as a resistance layer 4.

For structuring, an $SiO_2$ film 5 is sputtered onto the large surface area resistance layer 4 and those regions which later form the microactuators arranged for example in matrix form as mesa 6, are masked with photolacquer 7.

Figure 1B:
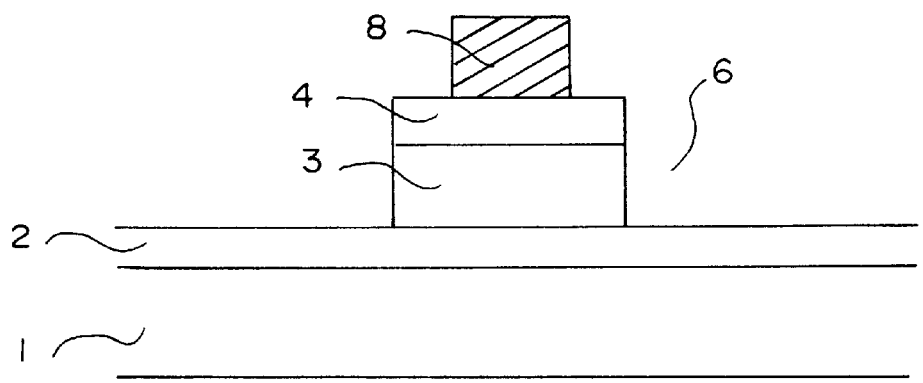
Figure 1C:
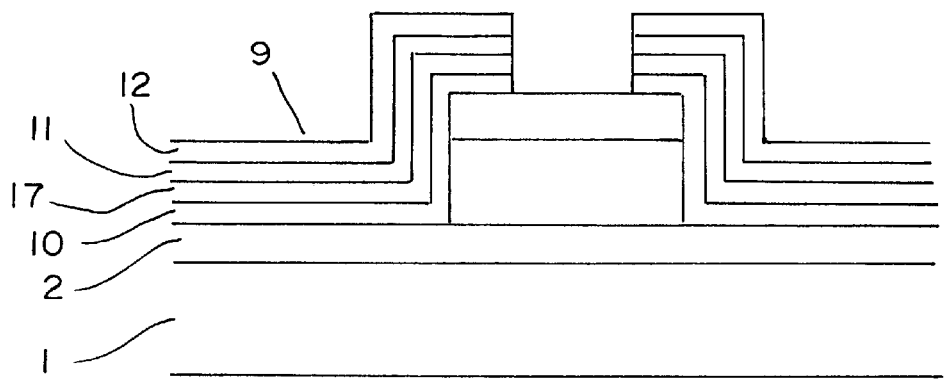

After a plasma etching step for mesa structuring, the 60×60 µm$^2$ size component mesa 6, as shown in FIG. 1b), is initially masked with a further photolacquer layer 8 to produce an electrical contact 9. The contact 9 is then sputtered on in layers (FIG. 1c). The contact 9 comprises a silicon contact layer 10$p^+$-doped with boron, a tungsten silicide layer 17, a tungsten silicide layer 11, into which 10 atom % nitrogen is incorporated, as well as a gold covering layer 12. The tungsten silicide layer 11 acts as a diffusion barrier between the silicon contact layer 10 and the gold covering layer 12. Lacquer layer 8 and regions of the contact 9 arranged above the lacquer layer are removed by a final lift-off step.

Emission structures must also be provided to use this microactuator as a thermopneumatic component. The microactuator sketched in FIG. 2 has a capillary channel structure 13, above which a nozzle plate 14 is arranged. A chamber 15, which is in contact with a nozzle opening 16 in the nozzle plate 14, is designed in the channel structure 13 in the region of the resistance layer 4. A liquid droplet may be emitted by applying a voltage pulse to the contact 9. When using corrosive liquids it is advantageous if the resistance layer 4 is provided with a passivating layer.

The structures 13, 14 and 15 can be made, for example from polyimide from Messrs. Olin Microelectronic Materials Series 7500. Hence the polyimide present in the form of a photosensitive lacquer is applied to the entire surface of the substrate, on which the microactuator or microactuators are arranged, and after tempering the channel structure 13 is structured photolithographically with chamber 15. The nozzle plate 14 is produced separately on a prestructured silicon substrate and detached following photolithographic structuring. The nozzle plate 14 is then adjusted on the channel structure 13 and bonded thermally with it. Finally, a connection piece made from refined steel is also adhered to the emission structure for supplying liquid to the channel structure 13.

It has been shown in tests that the lowest liquid layers can be heated in the course of a few microseconds to over 300° C. with the aid of the thermopneumatic microactuators of the invention during dynamic operation even at moderate heat capacities and hence are available to commercial uses. It could be proved by means of high-speed cinematography for different fluid media that nucleation of vapour bubbles takes place just 2 microseconds after the start of the heat pulse.

FIG. 3 shows the result of numerical investigations of the vertical temperature distribution of the thin-layer structure to a liquid at the time of nucleation. It is shown that the temperature in the liquid reaches a value of over 300° C., so that a temporally limited pressure having an amplitude between 50 and 100 bar can be produced using the thermopneumatic microactuator of the invention.

In addition to the preferred use of the microactuator as a thermopneumatic microactuator for, for example ink printing heads or as a device for fuel injection, one possible use is also as a power resistance or thermal actuator (heater). Furthermore, it may be considered for applications in medical technology, for example in the field of minimum invasive surgery. Hence microactuators can be arranged on a microneedle for precise heat treatment.

What is claimed is:

1. A microactuator arrangement comprising a microactuator, a substrate, and a thermally insulating layer wherein the thermally insulating layer is situated between the substrate and the microactuator wherein the microactuator has a resistance layer made from doped or graphitic diamond, which is provided with an electrical supply and an electrical leakage, wherein the thermally insulating layer is between 1 µm and 10 µm thick, and wherein the microactuator contains at least one intermediate layer, which is arranged between the thermally insulating layer and the resistance layer wherein the intermediate layer comprises laterally structured intrinsic diamond.

2. The microactuator arrangement according to claim 1 wherein the resistance layer has a surface area of less than 1 mm$^2$.

3. The microactuator arrangement according to claim 1 wherein the thermally insulating layer has a thermal conductivity of below 1 W cm$^{-1}$ K$^{-1}$ at 300 degrees K.

4. The microactuator arrangement according to claim 1 wherein the thermally insulating layer includes an amorphous material.

5. The microactuator arrangement according to claim 1 wherein the thermally insulating layer includes an electrical non-conductor.

6. The microactuator arrangement according to claim 1 wherein the material of the thermally insulating layer is selected from the group consisting of silicon oxides, silicon nitrides, silicon oxinitrides and aluminum oxides.

7. The microactuator arrangement according to claim 1 wherein the thermally insulating layer is arranged on the substrate and the substrate is selected from the group consisting of silicon and silicon carbide.

8. The microactuator arrangement according to claim 1 wherein the doping material concentration in the resistance layer is more than $10^{19}$ cm$^3$.

9. The microactuator arrangement according to claim 1 wherein the electrical supply and the electrical leakage comprise at least one contact material layer, a diffusion barrier arranged thereon and a metallic covering layer arranged on the diffusion barrier.

10. The microactuator arrangement according to claim 9 wherein the contact material layer includes amorphous silicon and the diffusion barrier includes amorphous tungsten silicide doped with nitrogen.

11. The microactuator arrangement according to claim 1 wherein the microactuator arrangement comprises a structure for emission of fluids.

12. The microactuator arrangement according to claim 11 wherein the structure for emission of fluids comprises a channel structure and a nozzle.

13. The microactuator arrangement according to claim 1 wherein a temperature sensor is arranged in the region of the microactuator.

14. The microactuator arrangement according to claim 13 wherein the microactuator itself forms the temperature sensor.

15. An article of manufacture for use as a thermal microactuator comprising the microactuator arrangement of claim 1 in a thermal microactuator.

16. An article of manufacture for use in the explosive evaporation of fluids comprising the microactuator arrangement of claim 1 in a device that evaporates fluids explosively.

17. An article of manufacture for use in fuel injection comprising the microactuator arrangement of claim 1 in a fuel injection device.

18. An article of manufacture for use as a thermopneumatic microactuator comprising the microactuator arrangement of claim 1 in a thermopneumatic microactuator.

19. An article of manufacture for use in an ink-jet printing head comprising the microactuator arrangement of claim 1 in an ink-jet printing head.

* * * * *